United States Patent [19]

Bloom

[11] Patent Number: 4,689,262

[45] Date of Patent: Aug. 25, 1987

[54] ELECTRICALLY INSULATING SUBSTRATE

[75] Inventor: Terry R. Bloom, Middlebury, Ind.

[73] Assignee: CTS Corporation, Elkhart, Ind.

[21] Appl. No.: 775,386

[22] Filed: Sep. 12, 1985

Related U.S. Application Data

[62] Division of Ser. No. 612,142, May 21, 1984, Pat. No. 4,572,754.

[51] Int. Cl.⁴ .................... B32B 18/00; C04B 35/74; C04B 37/02; H05K 1/03
[52] U.S. Cl. .................................... 428/201; 156/89; 174/68.5; 264/60; 264/61; 427/96; 428/209; 428/210; 428/247; 428/256; 428/901
[58] Field of Search ............... 428/209, 210, 201, 247, 428/256, 901; 156/89; 264/60, 61

[56] References Cited
U.S. PATENT DOCUMENTS 4,572,754 2/1986 Bloom .................................... 156/89

Primary Examiner—James C. Cannon
Attorney, Agent, or Firm—Rodger H. Flagg

[57] ABSTRACT

An apparatus for fabricating composite porcelain substrates employing alternating layers of wire cloth and porcelain green sheet material is disclosed, wherein those alternating layers are compressed toward one another at a somewhat elevated temperature and then kiln fired at a further elevated temperature to form a glazed porcelain surface for receiving further electrical circuitry, for example, of the microelectronic type. Such a composite porcelain substrate has good thermal properties of high conductivity and low coefficient of expansion as well as good electrical insulating properties and mechanical strength. In particular its thermal expansion properties are well matched to many surface mounted devices that may be placed on the substrate thereby reducing the likelihood of thermal damage of device connections. The substrate cost is very low in comparison to the currently available alternatives.

20 Claims, 4 Drawing Figures

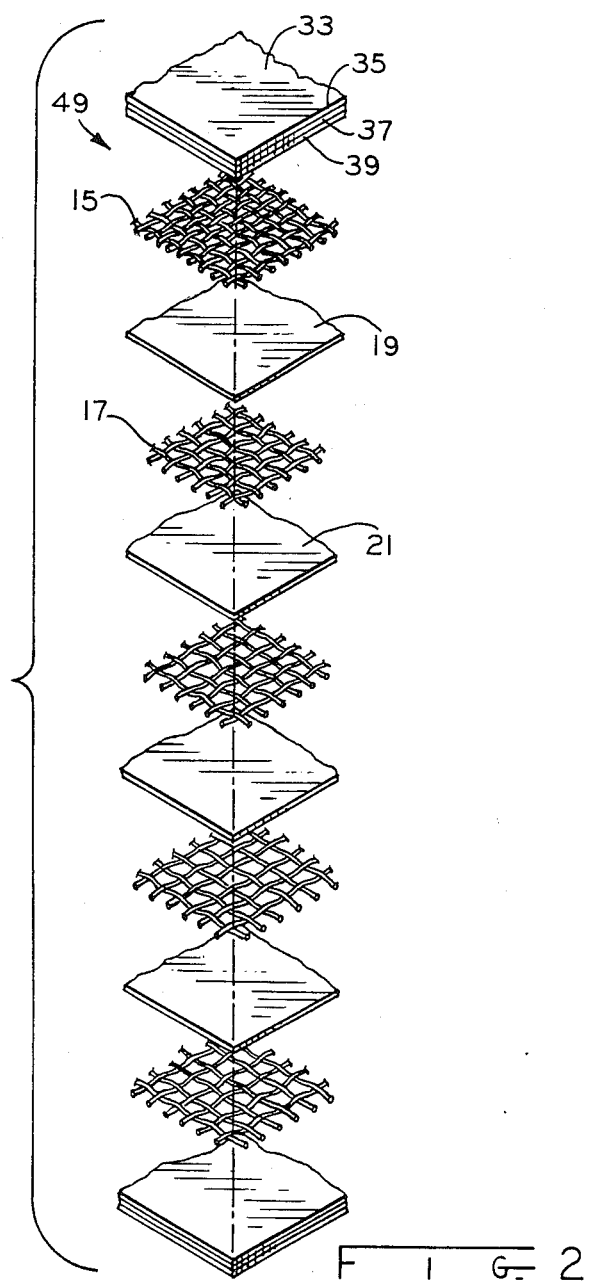

ELECTRICALLY INSULATING SUBSTRATE

This is a divisional application of Ser. No. 612,142, now U.S. Pat. No. 4,572,754, issued Feb. 25, 1986, filed May 21, 1984 for ELECTRICALLY INSULATING SUBSTRATE.

SUMMARY OF THE INVENTION

The present invention relates generally to insulated structures for supporting electronic circuitry and more particularly to substrates of the porcelain surface variety for microelectronic applications, such as thin film circuits or thick film circuits, frequently in conjunction with other electronic components, for example, of the high surface density mounted variety.

A wide variety of materials and devices are employed as substrates in the microelectronics industry. Common among these are low alkaline glasses, ceramics, sapphire, certain plastic films such as mylar, semiconductor materials such as silicon wafers frequently with an oxide surface, as well as more exotic materials, such as titanium dioxide. Selection of a particular substrate material almost invariably involves a tradeoff between the advantages and disadvantages of the particular substrate material.

Among the ceramic substrate materials, beryllia and alumina are the most commonly used and either may be employed with or without a surface glaze. Alumina ($AL_2O_3$) is most commonly used in thick film microelectronics since it possesses good thermal expansion properties, adequate mechanical strength, and good electrically insulating properties, however, the thermal conductivity for heat dissipation purposes of alumina is significantly less than that of beryllia. Beryllia on the other hand is quite expensive and its toxicity makes it very difficult to work with.

Another ceramic material having good electrical isolation properties is porcelain which is actually a subcategory of materials within the ceramic field. Porcelain materials in the green or unfired state have recently been fabricated as a tape-like strip which may be positioned as desired and then fired to provide an extremely good electrical insulator. Porcelain tapes of this type are described in detail in my copending application serial number 504,990, now U.S. Pat. No. 4,556,598, filed June 16, 1983 and assigned to the assignee of the present invention. Such porcelain tape, per se, is somewhat brittle after firing and is not a particularly good heat conductor and, thus, for some microelectronic circuit designs, would provide inadequate heat dissipation or inadequate structural strength. It would be highly desirable to use this economical and electrically suitable porcelain tape material as a microelectronic substrate without, however, the two above noted defects.

Microelectronic circuitry substrate technology has branched from simple glass and ceramic substrates in a number of directions. For example, in U.S. Pat. Nos. 3,518,756 and 4,109,377, a multilayer ceramic substrate includes conductive pathways between the ceramic layers. Sintered multilayer substrates of glass-ceramic materials, including circuit patterns, are shown in U.S. Pat. No. 4,413,061. Another approach to multilayered substrates having a plurality of electrically conductive layers forming the circuit pattern is U.S. Pat. No. 4,296,272. U.S. Pat. No. 4,313,262 discloses a molybdenum substrate having very good properties as a heat sink. None of these patented arrangements provides an inexpensive, general purpose substrate with low thermal expansion, high thermal conductivity, good electrical insulating properties and adequate structural strength. When multilayer techniques are employed in the prior art, the purpose is generally to provide electrical isolation between the several conductive circuit paths.

The entirety of my copending application Ser. No. 504,990 entitled Porcelian Tape for Producing Porcelainized Metal Substrates is specifically incorporated herein by reference. Among other things, that copending application discloses a scheme for the manufacture of multilayer porcelain substrates. A single layer or multiple layers of porcelain mixture with the flexible plastic carrier removed therefrom, may be disposed on a substrate, the subsequent second and third mixture layers being disposed one upon the other. After the lamination step in which the layer or multiple mixture layers are laminated to the metal substrate, a conductive paint may be printed in a conductive pattern on the top porcelain mixture layer and then dried. Next, a resistor paint may be screen printed in a pattern overlapping portions of the conductive pattern, and subsequently dried. Then another formed porcelain mixture layer is disposed over the top porcelain mixture layer with the thick film circuit disposed therebetween and laminated to the top layer, followed by the entire combination being fired in a one step firing process. Thus, multiple layers of porcelain mixtures each provided from a flexible porcelain tape, can be stacked one upon another over the subjacent substrate with thick film circuits disposed between laminated adjacent layers of porcelain mixtures, and then the entire combination fired in a single firing step wherein the resulting fired thick film circuits are protectively disposed between two porcelain layers intimately bonded one to another and the substrate. This, of course, protects the printed thick film circuits during firing from oxidation, both during the firing process and afterwards when the overlying fired porcelain mixture layer comprises an insulative porcelain layer. Alternatively, a printed thick film circuit not subject to the effects of oxidation need not have a porcelain mixture layer disposed thereover and may comprise the top most layer of the construction. In any of these methods, thick film conductive circuits may be screened onto the overlying porcelain layer or layers after the firing step, and then fired in another step.

The method for producing the flexible porcelain tape provides a porcelain material that is easily handled, formed and applied to a metal substrate whereby the flexible porcelain mixture cn be formed to the exact shape of the corresponding metal substrate. Equally important is the ability to readily manufacture multilayer porcelainized metal substrates wherein the thick film electrical circuits may be disposed between protective insulative porcelain layers or upon the top of a plurality of insulative porcelain layers to provide superior insulative separation and high dielectric strength between the circuits and subjacent metal substrate.

My copending application also discloses techniques such as the Teflon coating of pressure surfaces applied to such substrate materials. The metalic substrates employed in my prior application in the specifically disclosed examples were either steel or aluminum, however, the techniques of that application can be extended to other materials.

Among the several objects of the present invention, may be noted the provision of a microelectronic circuit substrate which capitalizes on the technology set forth in the above mentioned copending application; the provision of a substrate having thermal expansion and structural strength properties quite similar to alumina; the provision of a substrate having a thermal conductivity as good as ceramic coated, copper clad invar; the provision of a substrate of extremely low cost; the provision of a substrate having thermal expansion properties nearly the same as those of components to be received on the substrate; the provision of a method of fabricating an electrically insulative substrate for subsequent use in a microelectronic circuit; and the provision of a general purpose microelectronic circuit substrate incorporating sheets of wire cloth providing enhanced mechanical strength, improved thermal conductivity for heat dissipation purposes, radio frequency interference shielding comparable to conventional metalic chasis, and not a part of the microelectronic circuit, per se. These as well as other objects and advantageous features of the present invention will be in part apparent and in part pointed out hereinafter.

In general, a method of fabricating an elecrically insulative substrate includes providing interleaved porcelain green sheets and wire cloth sheets which are compressed toward one another and then kiln fired to form a glazed porcelain surface for receiving electrical circuitry.

Also in general and in one form of the invention, a composite substrate has a glazed porcelain circuitry receiving surface and comprises alternating layers of porcelain sheets and fine mesh metal screen compressed together with the porcelain sheets outermost.

BRIEF DESCRIPTION OF THE DRAWINGS

FIG. 2 is an exploded perspective view of a portion of an illustrative substrate;

Corresponding reference characters indicate corresponding parts throughout the several views of the drawing.

The exemplifications set out herein illustrate a preferred embodiment of the invention in one form, and such exemplifications are not to be construed as limiting the scope of the disclosure or the scope of the invention in any manner.

DESCRIPTION OF THE PREFERRED EMBODIMENT

Figure 1:
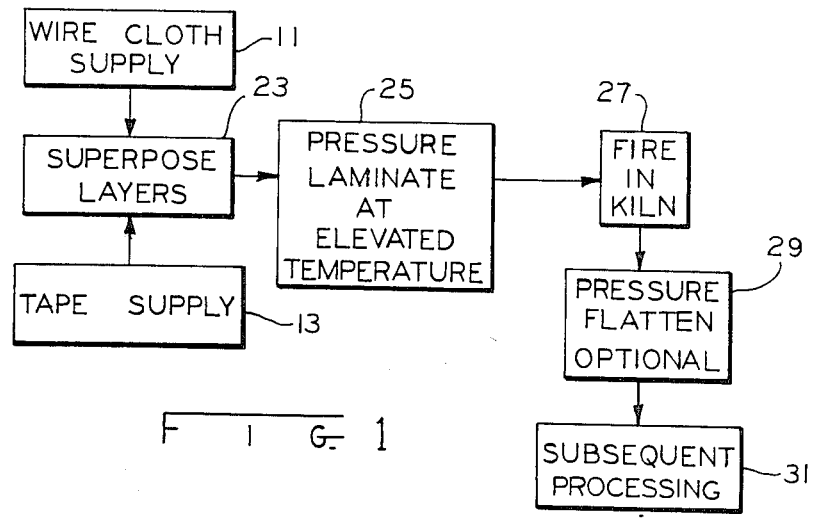
FIG. 1 is a block diagram depiction of the method of fabricating substrates in accordance with the present invention.

Referring first to the process depiction of FIG. 1 and the exploded perspective view of FIG. 2, sheets of wire cloth, such as an about 100 mesh copper screen having a thickness of about 10 to 12 mils and porcelain green sheets, for example, of the porcelain tape variety described in the above mentioned copending application, are provided from supply sources 11 and 13 respectively with the wire cloth sheets illustrated at 15 and 17 in FIG. 2 while the porcelain green sheets are illustrated at 19 and 21. The sheets are interleaved or superposed in layers at process stage 23. In one preferred form, every pair of wire cloth sheets is separated by at least one porcelain green sheet and most typically, by exactly one porcelain green sheet, while the upper and lower outermost porcelain green sheet layers are formed as three adjacent pieces of porcelain tape. This thicker outer layer aids in reducing any wrinkles or corrugations which might be induced due to the irregularities in the woven copper screen. Five screen layers with four intermediate separating porcelain tape layers and an additional three layers of tape at the outer surfaces has been found suitable.

Once the layers are appropriately interleaved, those interleaved sheets are subjected to pressure at process stage 25 so as to compress the interleaved sheets against one another, thereby forming a laminated composite substrate form still in a green state. This pressure may be accompanied by an elevation in temperature, for example, to around 200° F. (about 90° C.) with the pressure lamination occuring at around 4000 to 5000 pounds per square inch and for a time interval of, say, 3 to 5 minutes. Under such pressure the green sheets or porcelain tape tends to form about individual strands of the screen somewhat as illustrated in FIG. 4.

Subsequent to the pressure lamination the composite substrate, still in its green state, is kiln fired at 27, which again for exemplary purposes may be performed for about a six minute interval with the substrate temperature reaching a peak of around 700° C. Subsequent to such firing, the surface which is now a glazed porcelain surface, may be too irregular for some microelectronic circuit purposes, in which case an optional pressure flattening of the kiln fired sheets as illustrated at 29, may be performed. Such pressure flattening could be by compression between a pair of flat plates and at an elevated temperature of, say around 670° C. The thus formed substrate, either with or without the optional pressure flattening 29, may then undergo subsequent processing 31 of conventional type, such as the screening of thick film paints onto the glazed porcelain tape surface 33.

Figure 4:
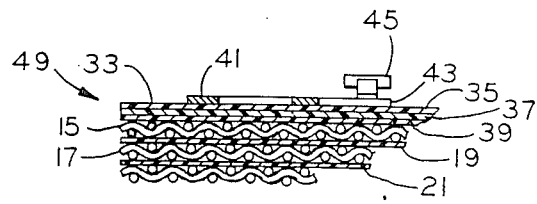
FIG. 4 is a partial view in cross section along lines 44 of FIG. 3.

Referring now to FIGS. 2 and 4 the substrate includes three sheets of porcelain tape 35, 37 and 39 followed by a wire cloth sheet 15 and then alternating porcelain tape and wire cloth sheets, such as 19, 17 and 21, continuing through a sequence of five wire cloth sheets and terminating at the bottom of the substrate with another three consecutive layers of porcelain tape.

Figure 3:
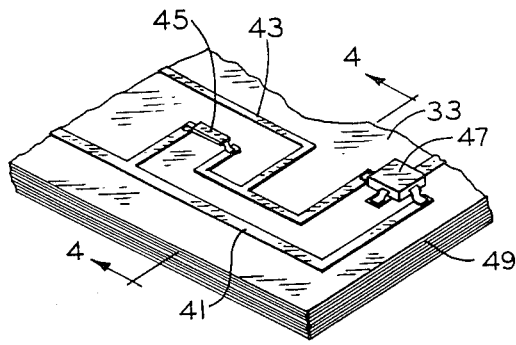
FIG. 3 is a perspective view illustrating the substrate of FIG. 2 with microelectronic conductors and circuit components received thereon.

The step of subsequently processing as depicted at 31 in FIG. 1, may include the painting or screening of thick film conductors, such as 41 and 43, to adhere to the surface of the substrate by conventional techniques and, again by conventional techniques, a plurality of surface mounted devices, such as 45 and 47, may be affixed to the porcelain substrate as by soldering to the thick film conductors. The good thermal conductivity of the copper allows these components, such as 45 and 47, to be mounted on the porcelain substrate in a high density manner while still adequately cooling the components. Components 45 and 47 as well as the thick film conductors 41 and 43 as illustrated in FIGS. 3 and 4 are, of course, only for illustrative purposes since the substrate 49 is, in a sense, a general purpose substrate and may be used for either thick or thin film purposes or other microelectronic application as desired.

The composite substrate, as thus far described, is particularly useful when its linear coefficient of thermal expansion is matched to the coefficient of surface mounted devices, such as resistors or capacitors, to be mounted on the substrate, since under the circumstances even though the substrate may expand due to heating, the surface mounted devices also expand reducing the likelihood of damage to components or connections due to that thermal expansion. Many of the surface mounted devices contemplated for use with the present substrate are alumina, which has a linear coefficient of about 60 inches per inch per degree centigrade and the substrates manufactured according to the techniques of the present invention generally lie withing the range of 50 to 120 inches per inch per degree centigrade with that coefficient being determined mostly by the glass employed in the tape composition.

In the aforementioned copending application, two specific examples of tape composition by weight, one for steel substrates and another for aluminum substrates, were disclosed. A presently preferred tape composition for use in the present invention is as follows:

500 g: Glass
116.7 g: Acryloid B7
45.0 g: MEK
100.0 g: Toluene
62.5 g: Acetone
12.0 g: Sanicizer 261
2.2 g: DC#3

The glass material in this typical tape composition is ELPOR 2010 available from Ferro Corporation, Cleveland, Ohio, while the remaining constituents are quite similar to those set forth in table 2 and table 4 of my aforementioned copending application. A composite substrate employing these components has a coefficient of expansion of about $82 \times 10^{-7}/°C$.

Another glass which may be employed has 40% lead oxide, 20% barium oxide and 40% silicon dioxide and when compounded, as above, provides a composite substrate having a coefficient of expansion of about $46 \times 10^{-7}/°C$.

From the foregoing it is now apparent that a novel composite substrate, as well as a novel method for fabricating a substrate from alternate layers of porcelain tape and wire screen, have been disclosed meeting the objects and advantageous features set out hereinbefore as well as others and that modifications as to the precise configuration, shapes and details may be made by those having ordinary skill in the art without departing from the spirit of the invention or the scope thereof as set out by the claims which follow.

I claim:

1. A precursor for an electrically insulating substrate having a glazed porcelain surface for receiving electrical circuitry thereon; comparatively low thermal coefficient of expansion; comparatively high thermal conductivity for heat dissipation; good electrical insulation properties; and sufficient mechanical strength for subsequent use in a microelectronic circuit having surface mounted devices disposed thereon; which comprises:
   a first plurality of porcelain green sheets having a relatively low linear thermal coefficient of expansion matched to the linear thermal coefficient of expansion of the surface mounted devices to be subsequently mounted upon the substrate; and a second plurality of fine mesh wire cloth sheets for mechanical strength and high thermal conductivity;
   said second plurality of fine mesh wire cloth sheets interleaved between the first plurality of porcelain green sheets to separate the fine mesh wire sheets by at least one porcelain green sheet to provide electrical insulation between the wire cloth sheets, wherein the interleaved porcelain green sheets and the fine mesh wire cloth sheets have been compressed against one another at a somewhat elevated temperature with sufficient pressure to form a laminated substrate, for subsequent firing at a further elevated temperature sufficient to form at least one outermost glazed porcelain surface.

2. The substrate of claim 1 wherein each metal screen layer comprises copper screen of about 100 mesh.

3. The composite of claim 1, subsequently fired, further including adhering at least one thick film conductor adhered to at least one of the outermost glazed porcelain surfaces.

4. The composite of claim 1, further subsequently fired, including screened and fired thick film paint adhered to at least one of the outermost glazed porcelain surfaces.

5. The composite of claim 1, wherein the first plurality of porcelain green sheets is ten and the second plurality of fine mesh wire cloth sheets is five, with three adjacent porcelain green sheets forming each of the outermost layers with alternating wire cloth sheets and porcelain green sheets interleaved therebetween.

6. The composite of claim 1, wherein the first plurality of porcelain green sheets is at least one greater than the second plurality of fine mesh wire cloth sheets and both outermost layers of the substrate each comprise a porcelain green sheet prior to firing.

7. The composite of claim 1, wherein every pair of fine mesh wire cloth sheets is separated by exactly one porcelain green sheet.

8. The substrate of claim 1, wherein the fine wire mesh sheets provide improved radio frequency interference shielding.

9. The composite of claim 1, wherein a porcelain green sheet is screened with a desired circuitry configuration, dried and interleaved with at least one other porcelain green sheet prior to firing, to protectively dispose the desired circuitry configuration between two adjacent porcelain sheets, to protect the desired circuitry configuration from oxidation.

10. The composite substrate of claim 9, wherein the desired circuitry configuration comprises a conductive paint.

11. The composite of claim 9, wherein the desired circuitry configuration comprises a resistive paint.

12. A fired composite insulating substrate for mounting electrical components thereon, which comprises:
   a plurality of porcelain sheets and fine wire mesh sheets, interleaved to insulate the fine wire mesh sheets between the porcelain sheets, said interleaved sheets having been pressure laminated prior to firing, wherein thermal energy generated by circuitry and electrical components mounted on the substrate is dissipated through at least one insulative porcelain sheet to the fine wire mesh sheets interleaved within the substrate, said fine wire mesh sheets providing the substrate with mechanical strength and thermal expansion characteristics comparable to alumina.

13. The substrate of claim 12 wherein each metal screen layer comprises copper screen of about 100 mesh.

14. The substrate of claim 12 wherein there is one porcelain sheet between each adjacent pair of metal screen layers and additionally three adjacent outermost porcelain sheets forming each of the opposed substrate surfaces.

15. The substrate of claim 12, wherein the desired circuitry configuration comprises a conductive paint and a resistive paint, the conductive and resistive paints each separately screened and dried to form a desired overlapping circuitry configuration.

16. The substrate of claim 12, wherein the fine wire mesh sheets provide radio frequency interference shielding.

17. An electrically insulating substrate having a glazed porcelain surface; comparatively low thermal coefficient of expansion; comparatively high thermal conductivity; good electrical insulation properties; and high mechanical strength formed by firing a composite comprising:
 a first plurality of porcelain green sheets having a relatively low linear thermal coefficient of expansion; and a second plurality of fine mesh wire cloth sheets interleaved between the first plurality of porcelain green sheets to separate the fine mesh wire sheets by at least one porcelain green sheet to provide electrical insulation between the wire cloth sheets, wherein the interleaved porcelain green sheets and the fine mesh wire cloth sheets are compressed against one another at a somewhat elevated temperature with sufficient pressure to form a laminated substrate.

18. The substrate of claim 17, wherein the first plurality of porcelain green sheets was at least one greater than the second plurality of fine mesh wire cloth sheets and both outermost layers of the substrate comprised a porcelain green sheet prior to firing.

19. The substrate of claim 17, wherein a desired circuitry configuration was screened and dried upon at least one porcelain green sheet prior to firing.

20. The substrate of claim 17, wherein a desired circuitry configuration has been screened and dried upon at least one of the outer glazed porcelain surfaces after firing.

* * * * *